United States Patent [19]
Dixit

[11] Patent Number: 5,329,153
[45] Date of Patent: Jul. 12, 1994

[54] ANTIFUSE WITH NONSTOICHIOMETRIC TIN LAYER AND METHOD OF MANUFACTURE THEREOF

[75] Inventor: Pankaj Dixit, San Jose, Calif.

[73] Assignee: Crosspoint Solutions, Inc., Santa Clara, Calif.

[21] Appl. No.: 866,037

[22] Filed: Apr. 10, 1992

[51] Int. Cl.$^5$ .......................................... H01L 27/02
[52] U.S. Cl. .................................... 257/530; 257/529; 257/764
[58] Field of Search .................... 257/529, 530; 365/96

[56] References Cited

U.S. PATENT DOCUMENTS

| | | |
|---|---|---|
| 3,571,673 | 3/1971 | Ovshinsky . |
| 3,675,090 | 7/1972 | Neale . |
| 4,442,507 | 4/1984 | Roesner . |
| 4,458,297 | 7/1984 | Stopper et al. . |
| 4,796,074 | 1/1989 | Roesner . |
| 4,914,055 | 4/1990 | Gordon et al. . |
| 5,070,384 | 12/1991 | McCollum et al. ................ 257/530 |
| 5,191,550 | 3/1993 | Kubota .................................. 365/96 |

FOREIGN PATENT DOCUMENTS

WO92013359 8/1992 PCT Int'l Appl. ................ 437/200

OTHER PUBLICATIONS

"Amorphous Silicon Antifuse Technology for Bipolar PROMS" 1986 Bipolar Circuits and Technology Meeting-1986 IEEE pp. 99-100.

*Primary Examiner*—Sheila V. Clark
*Attorney, Agent, or Firm*—Townsend and Townsend Khourie and Crew

[57] ABSTRACT

An antifuse in an integrated circuit which has first and second conducting lines, a semiconductor layer of amorphous silicon between the first and second conducting lines, and a barrier metal layer of TiN between the semiconductor layer and the first conducting layer is disclosed. The TiN layer is nonstoichiometric composition to enhance the probability of said antifuse having a desired resistance when said antifuse is programmed. More specifically, the TiN layer has a composition of $Ti_{1.0}N_{0.5-0.8}$.

13 Claims, 2 Drawing Sheets

ANTIFUSE WITH NONSTOICHIOMETRIC TIN LAYER AND METHOD OF MANUFACTURE THEREOF

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGAs). As the name implies, antifuses have a very high resistance (to form essentially an open circuit) in the unprogrammed ("off") state, and a very low resistance (to form essentially a closed circuit in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

Antifuses have various structures. One particular antifuse structure is described in U.S. Ser. No. 07/642,617, entitled "AN IMPROVED ANTIFUSE CIRCUIT STRUCTURE FOR USE IN A FIELD PROGRAMMABLE GATE ARRAY AND METHOD OF MANUFACTURE THEREOF," filed Jan. 17, 1991 by M. R. Holzworth et al. and assigned to the assignee of the present invention. In the described antifuse a semiconductor layer of amorphous silicon is sandwiched between two metal interconnection lines. A layer of TiW (titanium-tungsten) forms a barrier metal layer between the semiconductor layer and each metal interconnection layer.

Barrier metal layers function to block the undesired interdiffusion of a semiconductor layer and a metal layer, which, in the case of the described antifuse, is the amorphous silicon layer and each interconnection layer formed from aluminum alloy. Barrier metal layers are typically refractory metals, their intermetallics, alloys, silicides, nitrides and combinations thereof. Thus a typical barrier metal layer is TiN (titanium nitride).

However, it has been found that antifuses formed with TiN barrier metal layers have a discernable probability of having an undesirably high programmed resistance ($R_{ON}$). TiN processes are familiar to many integrated circuit manufacturers and commonly used by them. This familiarity and use makes such manufacturers reluctant to abandon their TiN process in order to implement the antifuse structure. Furthermore, in semiconductor processing technology it is a general rule that manufacturers are reluctant to substitute any process for another due to cost and time constraints.

The present invention addresses this problem of TiN barrier metal layers in antifuses and provides for a solution by which TiN barrier metal processing technology may be adapted for use in manufacturing antifuses in integrated circuits without the problem described above.

SUMMARY OF THE INVENTION

The present invention provides for an antifuse in an integrated circuit which has first and second conducting lines, a semiconductor layer of amorphous silicon between the first and second conducting lines, and a barrier metal layer of TiN between the semiconductor layer and the first conducting layer. The TiN layer is a nonstoichiometric composition to enhance the probability of said antifuse having a desired resistance when said antifuse is programmed. More specifically, the TiN layer has a composition of $Ti_{1.0}N_{0.5-0.8}$.

The present invention also provides for a method of forming an antifuse in an integrated circuit which has an insulating layer on a semiconductor substrate. A first metal interconnection layer on the insulating layer and a first barrier metal layer on the first metal interconnection layer. An amorphous silicon layer is formed on the first barrier metal layer, followed by the formation of a second barrier metal layer on the amorphous silicon layer. Finally, a second metal interconnection layer is formed on said second barrier metal layer. To enhance the probability of the antifuse having a desired resistance when the antifuse is programmed, in at least one of said barrier metal forming steps a nonstoichiometric TiN layer is formed.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENTS

The problem of TiN barrier layers is described in the context of an embodiment of the particular antifuse disclosed in the above-noted patent application. However, as will be evident, the solution provided by the present invention is not necessarily limited to the particular antifuse discussed.

Figure 1A:
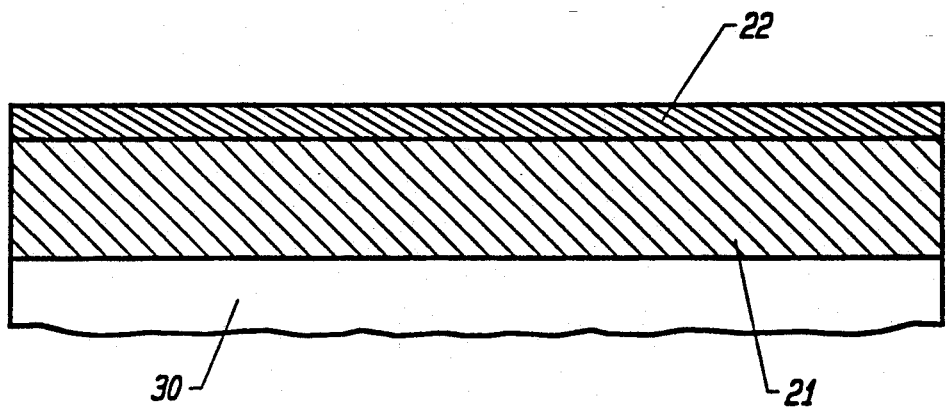
FIGS. 1A–1C show a sequence of steps used to manufacture an antifuse structure.

For ease of understanding the present invention, the process for manufacturing one embodiment of an antifuse is as follows:

FIG. 1A shows the step in the manufacturing process after the transistors and other circuit structures have been created in a semiconductor substrate and one or more polysilicon layers with intermediate insulating silicon dioxide layers have been deposited and defined.

As shown in FIG. 1A, a representative layer 30 of silicon dioxide is deposited over the substrate (not shown). Through standard masking and etching procedures, apertures are created in the layer 30. Then a metal layer 21 of aluminum is deposited. This is followed by a barrier metal layer 22.

Then the layers 21 and 22 are masked and etched by standard semiconductor processing techniques. In particular, the metal layers 21 and 22 are in physical and electrical contact to various points in the underlying parts of the integrated circuit through the apertures in the insulating layer 30.

After the layers 21 and 22 are deposited and defined, another insulating layer 31 of silicon dioxide is deposited over the substrate and the layers 21 and 22. A contact hole 29 is formed in the silicon dioxide layer 31 where an antifuse is desired by conventional masking and etching procedures.

Figure 1B:
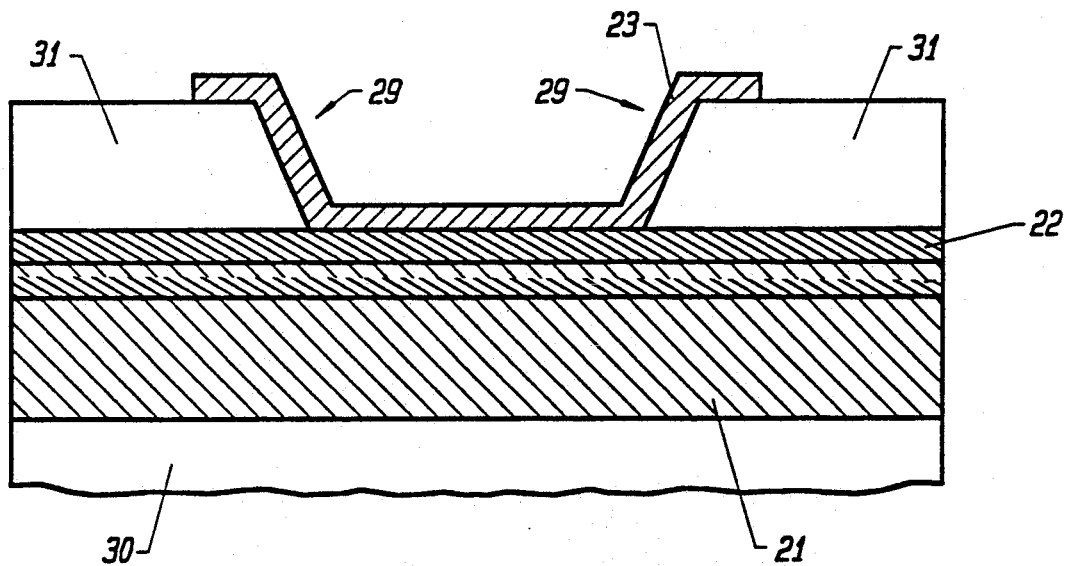

Then a semiconductor material layer 23 of amorphous silicon is deposited and defined by standard masking and etching steps so that a portion of the layer 23 covers the contact hole 29. The amorphous silicon may be doped or undoped. A thickness in the range of 500 to 1500 Angstroms has been found to work quite well in the antifuse structure, with an thickness of approximately 800 Angstroms being optimal. These thicknesses are applicable when 10 to 15 V programming voltage is used. For substantially different programming voltages film thicknesses change accordingly. The results are shown in FIG. 1B.

To ensure the integrity and reliability of the layer 21, the deposition of the amorphous silicon layer 23 should be performed at temperatures below 450 degrees C. Plasma-enhanced chemical vapor deposition (PECVD) and sputter deposition may be used to deposit amorphous silicon at such comparatively low temperatures. Presently most amorphous silicon is deposited by low pressure chemical vapor deposition (LPCVD) at temperatures of about 550 degrees C.

Furthermore, it is important that the hydrogen content of the amorphous silicon layer 23 be kept in the range of 10–20% by composition so that the layer 23 has the optimum characteristics suitable for an antifuse. In the PECVD process, which uses silane and argon, this is achieved by increasing the flow of the inert gas, argon, over its nominal flow rate in the process or adjusting the temperature of deposition.

Figure 1C:
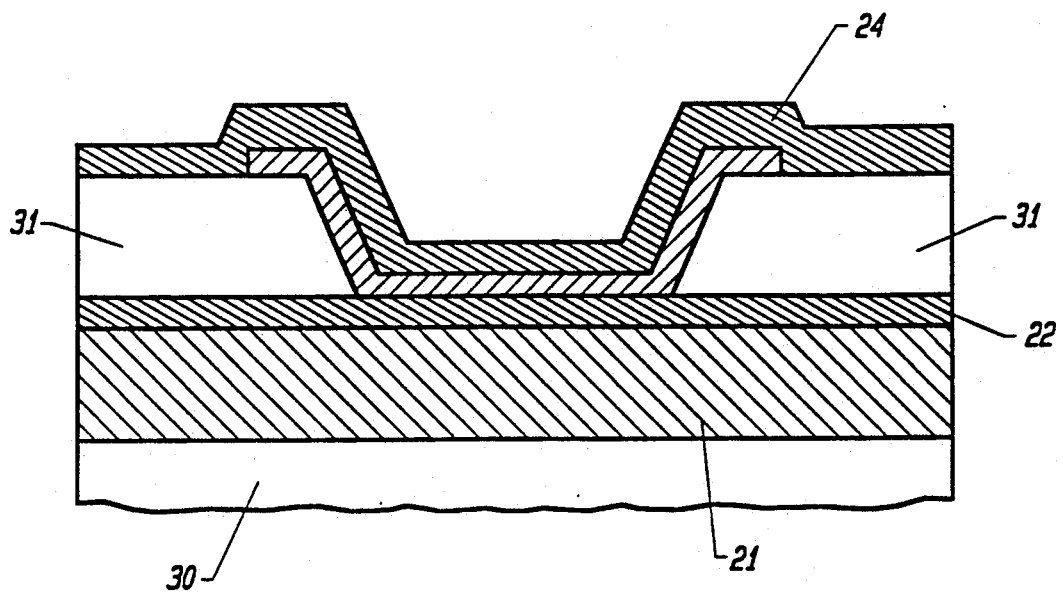
Figure 2:
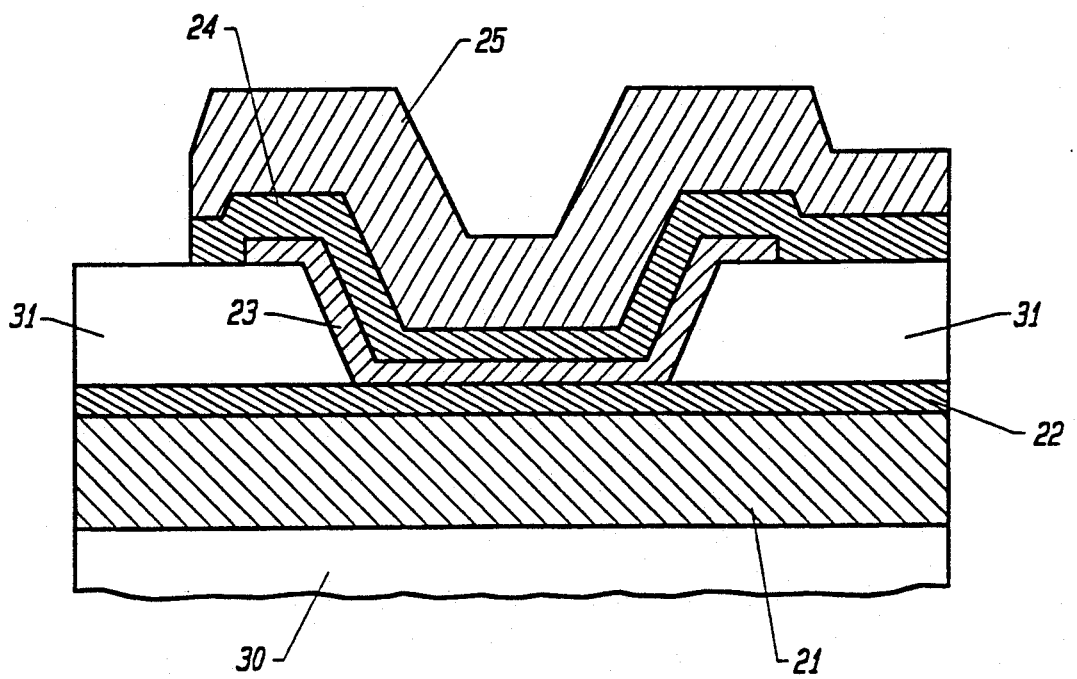
FIG. 2 is a cross-sectional diagram illustrating the resulting antifuse structure of the process steps shown in FIGS. 1A–1C.

As shown in FIG. 1C, a second layer 24 of barrier metal is deposited. This is followed by the deposition of the second interconnecting aluminum layer 25. Both metal layers 24 and 25 are then defined by standard masking and etching techniques. The completed antifuse structure is illustrated in FIG. 2.

Thus the antifuse is formed between two metal interconnection layers 21 and 25 located above the surface of the integrated circuit substrate. Typically, as described above, these metal interconnection layers are formed from aluminum alloys. The antifuse structure may be formed between any two metal interconnection layers. In a double-metal process, for example, these layers 21 and 25 are the metal-1 and metal-2 layers.

Sandwiched between the layers 21 and 25 are the first barrier metal layer 22 in contact with the lower metal layer 21, a layer 23 of semiconductor material, amorphous silicon, and a second barrier metal layer 24 in contact with the upper metal layer 25. These barrier metal layers 22 and 24 respectively contact the lower and upper surfaces of the amorphous silicon layer 23 which is formed with a thickness of approximately 800 Angstroms. The amorphous silicon layer 23 acts as an insulating layer between the conducting layers 21 and 25 unless the antifuse is programmed. When the antifuse is programmed, a conductive link is formed through the amorphous silicon layer 23 and a very low resistance contact is formed between the interconnection layers 21 and 25.

With the described antifuse having barrier layers 22 and 24 of TiW, titanium-tungsten alloy, a low programmed resistance ($R_{ON}$) of 100 ohms is typically obtained with a normal distribution about this mean value. Virtually no $R_{ON}$ is greater than 200 ohms. Programming is performed by a 10 mA, 5 ms pulse between the two conducting layers 21, 25.

When the TiW layers are replaced by barrier metal layers of TiN, titanium nitride, the $R_{ON}$ distribution changes. While most of the programmed antifuses have an $R_{ON}$ value of 100 ohms, a substantial number of antifuses, 10–20 percent, have a $R_{ON}$ value of greater than 200 ohms. This is troubling because the distribution of programmed resistances of the antifuses should be within a specified range or the circuit behavior unacceptably varies from die to die.

To improve the statistical probability of programmed resistances to less than 200 ohms, the present invention modifies the composition of TiN to a nonstoichiometric titanium nitride layer, i.e., from $Ti_{1.0}N_{1.0}$ to $Ti_{1.0}N_{0.5-0.8}$. Heretofore, semiconductor processes have used stoichiometric titanium nitride ($Ti_{1.0}N_{1.0}$) layers, which have many properties suitable for barrier metal functions. By modifying the stoichiometry of a TiN layer in an antifuse such that the amount of nitrogen is reduced compared to titanium, it is possible to obtain antifuses with a $R_{ON}$ statistical distribution like that of antifuse with TiW barrier layers.

Furthermore, stated more precisely, the nonstoichiometric TiN layer is required to be located on the side of the amorphous silicon layer opposite the conducting layer which has a positive voltage with respect to the second conducting layer during the programming of the antifuse. For example, in the antifuse illustrated in FIG. 2, the barrier metal layer 22 should be nonstoichiometric if the aluminum layer 25 is positive with respect to the aluminum layer 21 during programming. The barrier metal layer 24 for the layer 25 is not required to be nonstoichiometric if the layer 24 is formed from titanium nitride. The reason for the location of the nonstoichiometric TiN layer with respect to the polarity of programming voltages is stated below.

A titanium nitride layer of $Ti_{1.0}N_{0.5-0.8}$ stoichiometry works very well in enhancing the statistical distribution of programmed resistances. It is believed that the reason for this effectiveness is as follows. With TiW barrier metal layers, an antifuse is programmed when the titanium and/or tungsten atoms physically move into the amorphous silicon layer. The metal atoms react with amorphous silicon layer to form a conductive silicide link between the two conducting layers. When one of the barrier metal layers (and its respective conducting layer) has a positive potential, metal atoms move from the second barrier metal layer.

With the first barrier metal at a positive potential at the time when the electric breakdown potential, i.e., the programming voltage, is applied across the amorphous silicon layer between the two barrier metal layers in the antifuse, a tremendous electron "wind" is generated from the second barrier metal toward the first barrier metal layer. The electron wind also carries along the positively charged atoms present in the second barrier metal layer, such as Ti and W. Since titanium is a lighter element, at atomic number 22, it is much more easily transportable than tungsten at atomic number 74.

These metal atoms then react with the amorphous silicon to form a silicide. The silicide formation is facilitated by the localized heating at the breakdown potential. This silicide link is the conduction path between the two barrier metal (and interconnection) layers. The diameter of the silicide link, which is correlated to the programming current, is also correlated to the $R_{ON}$ of the antifuse.

In the case of a TiW barrier metal layer, both Ti and W are bonded to each other weakly by sharing outer d-orbital electrons. These bonds can be very easily broken by a fairly small amount of energy. Therefore, both Ti and W are readily available in atomic form. It is, therefore, quite easy to form the silicide link and achieve a consistent $R_{ON}$ for the programmed antifuses.

However, in the case of a TiN barrier metal layer, there is a strong bond between titanium and nitrogen. There is a high potential energy barrier for such a bond and a fair amount of energy must be supplied to overcome this barrier. In the dynamic environment of antifuse programming, certain events must occur in the right sequence to achieve a good programmed resistance. The bonding between Ti and N must break, the titanium must be maintained in its ionic state before it recombines with nitrogen and "sufficient" titanium ions must be available to migrate into the amorphous silicon layer to form a good silicide link. Nitrogen, being a negative charged ion, is repelled by the electron wind and does not migrate into the amorphous silicon layer. With equal amounts of titanium and nitrogen in a stoichiometric TiN layer, there appears a 80–90 percent chance of the events happening such that good $R_{ON}$ is achieved.

However, the resulting statistical distribution of programmed resistances is not satisfactory compared to the antifuses with TiW barrier metal layers. With nonstoichiometric TiN having a titanium-rich composition, sufficient free titanium, which is not strongly bound to nitrogen, becomes available to create a "TiW-like" environment to increase the probability of forming good silicide links in the amorphous silicon layer.

The amount of free titanium available for forming the silicide links in the amorphous silicon layer can be controlled by the stoichiometry of the TiN barrier metal layer, i.e., by lowering the fraction X in the nonstoichiometric $Ti_{1.0}N_X$ layer, the amount of free titanium is increased. Alternatively, if the TiN deposition equipment is restricted to yielding only a certain ratio of Ti and N in the nonstoichiometric layer (i.e., X has a floor), then the total amount of free Ti can be obtained by adjusting the thickness of the TiN layer. More free titanium is available with a thicker layer of nonstoichiometric TiN layer.

Nonstoichiometric TiN is obtained by modifying a standard process for depositing stoichiometric titanium nitride. Such a standard process is performed by sputtering titanium atoms from a titanium target onto a semiconductor wafer in a sputtering chamber filled with a predetermined nitrogen gas mixture, typically $Ar:N_2$, at a predetermined temperature and power. A nonstoichiometric TiN layer is deposited on the wafer by reducing the deposition temperature, reducing the $N_2$ ratio in the gas mixture, increasing the deposition power, or a combination of these steps.

While the above is a complete description of the preferred embodiments of the invention, various alternatives, modifications and equivalents may be used. It should be evident that the present invention is equally applicable by making appropriate modifications to the embodiments described above. For example, while discussion above was made in light of an amorphous silicon layer, it is believed that a nonstoichiometric TiN layer would work well with an antifuse with another semiconductor layer, such as germanium. Therefore, the above description should not be taken as limiting the scope of the invention which is defined by the appended claims.

What is claimed is:

1. In an integrated circuit an antifuse comprising first and second conducting lines;
   a semiconductor layer between said first and second conducting lines; and
   a barrier metal layer of TiN between said semiconductor layer and said first conducting layer, said TiN layer being of nonstoichiometric composition; whereby the probability of said antifuse having a desired resistance when said antifuse is programmed is enhanced.

2. The antifuse of claim 1 wherein said TiN layer has a composition of $Ti_{1.0}N_{0.5-0.8}$.

3. The antifuse of claim 1 wherein said second conducting layer lies over said first conducting layer.

4. The antifuse of claim 1 wherein said second conducting layer has a positive voltage with respect to said first programming layer when said antifuse is programmed.

5. The antifuse of claim 4 wherein said second conducting layer lies over said first conducting layer.

6. The antifuse of claim 1 further comprising a second barrier metal layer between said semiconductor layer and said second conducting layer.

7. The antifuse of claim 1 wherein said semiconductor layer comprises amorphous silicon.

8. The antifuse of claim 1 wherein said first and second conducting layers comprise metal.

9. In an integrated circuit having a semiconductor substrate and an insulating layer formed thereover, an antifuse comprising
   a first metal interconnection layer on said insulating layer;
   a first barrier metal layer on said first metal conducting layer;
   a semiconductor layer on said first barrier metal layer;
   a second barrier metal layer on said semiconductor layer; and
   a second metal interconnection layer on said second barrier metal layer;
   at least one of said barrier metal layers formed by nonstoichiometric composition of TiN whereby the probability of said antifuse having a desired resistance when said antifuse is programmed is enhanced.

10. The antifuse of claim 9 wherein said TiN layer has a composition of $Ti_{1.0}N_{0.5-0.8}$.

11. The antifuse of claim 10 wherein one of said metal interconnection layers has a positive voltage with respect to the second of said metal interconnection layers during the programming of said antifuse, said barrier metal layer of nonstoichiometric TiN located opposite said one metal interconnection line with respect to said semiconductor layer.

12. The antifuse of claim 11 wherein said semiconductor layer comprises amorphous silicon.

13. The antifuse of claim 12 wherein said first and second metal interconnection lines comprise aluminum.

* * * * *